US012174398B2

(12) United States Patent
Lu et al.

(10) Patent No.: US 12,174,398 B2
(45) Date of Patent: Dec. 24, 2024

(54) METHOD FOR FORMING MICRO-LENS ARRAY AND PHOTOMASK THEREFOR (71) Applicant: VisEra Technologies Company Limited, Hsin-Chu (TW)

(72) Inventors: Jyun-You Lu, Tianzhong Township, Changhua County (TW); Hsin-Yen Tsai, Zhudong Township, Hsinchu County (TW); Hao-Min Chen, Chiayi (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 19 days.

(21) Appl. No.: 17/228,031

(22) Filed: Apr. 12, 2021

(65) Prior Publication Data
US 2021/0231840 A1    Jul. 29, 2021

Related U.S. Application Data (63) Continuation of application No. 15/970,054, filed on May 3, 2018, now abandoned.

(51) Int. Cl.
*G03B 3/00*    (2021.01)
*G02B 3/00*    (2006.01)
(Continued)

(52) U.S. Cl.
CPC ......... *G02B 3/0012* (2013.01); *G03F 7/0007* (2013.01); *H01L 27/14627* (2013.01)

(58) Field of Classification Search
None
See application file for complete search history.

(56) References Cited

U.S. PATENT DOCUMENTS 5,170,293 A    12/1992    Tanimoto
5,538,817 A    7/1996    Smith et al.
(Continued)

FOREIGN PATENT DOCUMENTS

CN    101001322 A    7/2007
CN    102290423 A    12/2011
(Continued)

OTHER PUBLICATIONS

Office Action mailed Aug. 28, 2020 in corresponding CN Application No. 201811407906.X (10 pages).
(Continued)

*Primary Examiner* — Martin J Angebranndt
(74) *Attorney, Agent, or Firm* — Muncy, Geissler, Olds & Lowe, P.C.

(57) ABSTRACT

A method for forming a micro-lens array is provided. According to the method, a substrate is provided, and a hard-mask layer is formed. A lithography process is performed on the hard-mask layer by a hard-mask to form a first pattern and a second pattern. Then, the first pattern and the second pattern are reflowed to form a first lens structure and a second lens structure respectively. The photomask includes a first pattern segment and a second pattern segment, and the second pattern segment includes a transparent region and an opaque region. An area of the transparent region of the second pattern segment is larger than 18% of an area of the second pattern segment.

6 Claims, 11 Drawing Sheets

(51) Int. Cl.
*G03F 1/50* (2012.01)
*G03F 7/00* (2006.01)
*H01L 27/142* (2014.01)
*H01L 27/146* (2006.01)

(56) References Cited

U.S. PATENT DOCUMENTS

| | | | |
|---|---|---|---|
| 5,948,281 A | 9/1999 | Okazaki et al. | |
| 6,055,107 A * | 4/2000 | Li | G02B 5/1857 |
| | | | 430/323 |
| 7,160,649 B2 | 1/2007 | Lizotte | |
| 7,736,939 B2 | 6/2010 | Wu et al. | |
| 8,075,810 B2 | 12/2011 | Kawasaki | |
| 8,097,890 B2 | 1/2012 | Qian et al. | |
| 8,198,119 B2 | 6/2012 | Hsieh | |
| 8,293,565 B2 | 10/2012 | Ootake | |
| 8,913,165 B2 | 12/2014 | Okigawa | |
| 9,678,381 B2 | 6/2017 | Akasaka | |
| 2003/0071271 A1 | 4/2003 | Suzuki et al. | |
| 2003/0129502 A1* | 7/2003 | Chen | G03F 1/36 |
| | | | 430/394 |
| 2003/0179329 A1 | 9/2003 | Choi | |
| 2004/0048469 A1* | 3/2004 | Wu | G03F 1/36 |
| | | | 438/689 |
| 2004/0253549 A1 | 12/2004 | Ogusu | |
| 2005/0061772 A1* | 3/2005 | Amemiya | G02B 3/0012 |
| | | | 216/26 |
| 2005/0067286 A1 | 3/2005 | Ahn et al. | |
| 2005/0078377 A1 | 4/2005 | Li et al. | |
| 2005/0233228 A1 | 10/2005 | Fijol et al. | |
| 2006/0183027 A1 | 8/2006 | Lin et al. | |
| 2008/0000872 A1* | 1/2008 | Amemiya | G02B 3/0012 |
| | | | 216/2 |
| 2008/0157246 A1* | 7/2008 | Han | H01L 27/14685 |
| | | | 257/E31.127 |
| 2008/0290383 A1* | 11/2008 | Dunne | G02B 3/0018 |
| | | | 257/292 |
| 2009/0121371 A1* | 5/2009 | Kawasaki | G02B 3/0018 |
| | | | 264/2.7 |
| 2009/0147379 A1 | 6/2009 | Li et al. | |
| 2009/0174945 A1* | 7/2009 | Lin | B29D 11/00365 |
| | | | 430/5 |
| 2009/0200623 A1 | 8/2009 | Qian et al. | |
| 2009/0305453 A1* | 12/2009 | Yang | H01L 27/14685 |
| | | | 438/70 |
| 2011/0311919 A1 | 12/2011 | Yang et al. | |
| 2012/0225516 A1* | 9/2012 | Hsieh | H01L 27/14685 |
| | | | 257/E31.127 |
| 2013/0087874 A1* | 4/2013 | Yomori | H01L 27/14685 |
| | | | 257/E31.127 |
| 2013/0100324 A1* | 4/2013 | Ogino | H01L 27/14627 |
| | | | 257/E31.127 |
| 2013/0134540 A1* | 5/2013 | Maeda | H01L 27/1464 |
| | | | 438/69 |
| 2014/0218572 A1 | 8/2014 | Ootsuka | |
| 2014/0306360 A1* | 10/2014 | Li | G02B 3/0043 |
| | | | 264/1.7 |
| 2015/0102442 A1* | 4/2015 | Ootsuka | H04N 23/672 |
| | | | 257/432 |
| 2015/0123227 A1* | 5/2015 | Ootsuka | G02B 3/0062 |
| | | | 257/432 |
| 2017/0094210 A1 | 3/2017 | Galor Gluskin | |
| 2017/0366770 A1* | 12/2017 | Yokogawa | G02B 7/34 |
| 2018/0026065 A1* | 1/2018 | Hsieh | H01L 27/14605 |
| | | | 257/432 |
| 2018/0131862 A1 | 5/2018 | Galor Gluskin et al. | |
| 2019/0052823 A1 | 2/2019 | Jung et al. | |
| 2019/0075233 A1 | 3/2019 | Galor Gluskin et al. | |
| 2019/0132506 A1* | 5/2019 | Cheng | H01L 27/14603 |
| 2019/0339422 A1 | 11/2019 | Lu et al. | |

FOREIGN PATENT DOCUMENTS

| | | |
|---|---|---|
| CN | 103828354 A | 5/2014 |
| CN | 105378926 A | 3/2016 |
| CN | 105390511 A | 3/2016 |
| CN | 107644884 A | 1/2018 |
| JP | H0467613 A | 3/1992 |
| JP | H06334160 A | 12/1994 |
| JP | H1074927 A | 3/1998 |
| JP | 2000206310 A | 7/2000 |
| JP | 2002076315 A * | 3/2002 |
| JP | 2003228171 A | 8/2003 |
| JP | 2005-265963 A | 9/2005 |
| JP | 2006030651 A | 2/2006 |
| JP | 2007025524 A | 2/2007 |
| JP | 2007079371 A | 3/2007 |
| JP | 4186238 B2 | 11/2008 |
| JP | 2010171450 A | 8/2010 |
| JP | 2011013411 A * | 1/2011 |
| JP | 2011248306 A | 12/2011 |
| JP | 2012156212 A | 8/2012 |
| JP | 2014107593 A | 6/2014 |
| JP | 2009152314 A * | 6/2015 |
| JP | 2016111184 A | 6/2016 |
| KR | 100734691 B1 * | 7/2007 |
| WO | WO-2012086163 A1 | 6/2012 |

OTHER PUBLICATIONS

Office Action issued Aug. 31, 2019 in corresponding JP Application No. 2018-150315 (3 pages).
Office Action dated May 7, 2019 issued in corresponding TW Application No. 107138734 (5 pages).
Machine translation of JP 2011-13411 (Jan. 2011).
Machine translation of JP 04-067613 (Mar. 1992.

* cited by examiner

METHOD FOR FORMING MICRO-LENS ARRAY AND PHOTOMASK THEREFOR

CROSS REFERENCE TO RELATED APPLICATIONS

The present application is a continuation application of and claims priority from U.S. patent application Ser. No. 15/970,054, filed on May 3, 2018 and now abandoned, the content of which is hereby incorporated b reference in its entirety.

BACKGROUND OF THE INVENTION

Field of the Invention

The invention relates to a method for forming a micro-lens array, and more particularly to a method for forming micro-lenses with multi-heights by performing a single lithography process.

Description of the Related Art

Image sensors are devices capable of recoding an image of an object by converting a photo signal, which is received from the object, to an electronic signal. Currently, image sensors can be categorized into complementary metal oxide semiconductor (CMOS) devices and charge coupled devices (CCDs). A typical image sensor includes a lens array composed of a plurality of lenses. In general, each lens corresponds to one pixel unit, and the heights of the lenses are the same. However, in some cases where at least one of the lenses corresponds to more than one pixel unit, the height of the large lens may be smaller than the heights of the other lenses due to some limitations of the current manufacture processes, which results in worse conversion efficiency of the corresponding pixel units.

BRIEF SUMMARY OF THE INVENTION

An exemplary embodiment of a method for forming a micro-lens array is provided. The method comprises the steps of forming a hard-mask layer; performing a lithography process on the hard-mask layer by a photomask to form a first pattern and a second pattern; and reflowing the first pattern and the second pattern to form a first lens structure and a second lens structure respectively. The photomask comprises a first pattern segment and a second pattern segment, and the second pattern segment comprises a transparent region and an opaque region. An area of the transparent region of the second pattern segment is larger than 18% of an area of the second pattern segment.

In an exemplary embodiment, the photomask comprises a first pattern segment and a second pattern segment. The second pattern segment comprises a transparent region and an opaque region. An area of the transparent region of the second pattern segment is larger than 18% of an area of the second pattern segment.

A detailed description is given in the following embodiments with reference to the accompanying drawings.

BRIEF DESCRIPTION OF THE DRAWINGS

The invention can be more fully understood by referring to the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
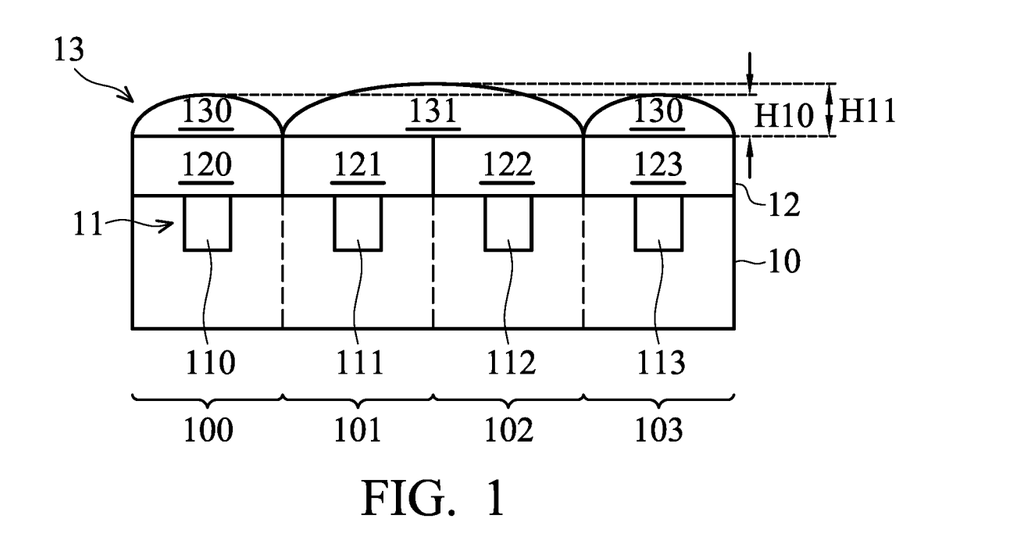
FIG. 1 shows one exemplary embodiment of a cross section of an image sensor.

FIG. 1 shows an exemplary embodiment of a cross section of an image sensor. Referring to FIG. 1, an image sensor 1 comprises a plurality of micro-lenses which are arranged in rows and columns to form a micro-lens array 13. For clear illustration, FIG. 1 shows two micro lenses 130 and a micro-lens 131 for the side view. The number of micro-lenses in the micro-lens array 13 is determined according to the design requirements. As shown in FIG. 1, a substrate 10 is provided. A plurality of photo-sensors are formed in the substrate 10 and arranged in rows and columns to form a photo-sensor array 11. In FIG. 1, four photo-sensors 110-113 are shown. A filter layer 12 is formed on the substrate 10. The filter layer 12 comprises filters, and one filter corresponds to one photo-sensor. The filters of the filter layer 12 may be color filters, such as red filters, green filters, and blue filters for the primary color system, or cyan filters, yellow filters, and magenta filters for the complementary color system. For clear illustration, FIG. 1 shows four color filters 120-123. The color filters 120-123 are the filters for at least two different colors or for a specific color. In the embodiment, a pixel unit is defined by a set of one photo-sensor and one filter, and the image sensor 1 is divided into several pixel regions by using the pixel unit. As shown in FIG. 1, the substrate 10 is divided into four equal pixel regions 100-103 by using the pixel unit, and the photo-sensors 110~113 are formed in the regions 100~103 of the substrate 10 respectively.

Figure 2:
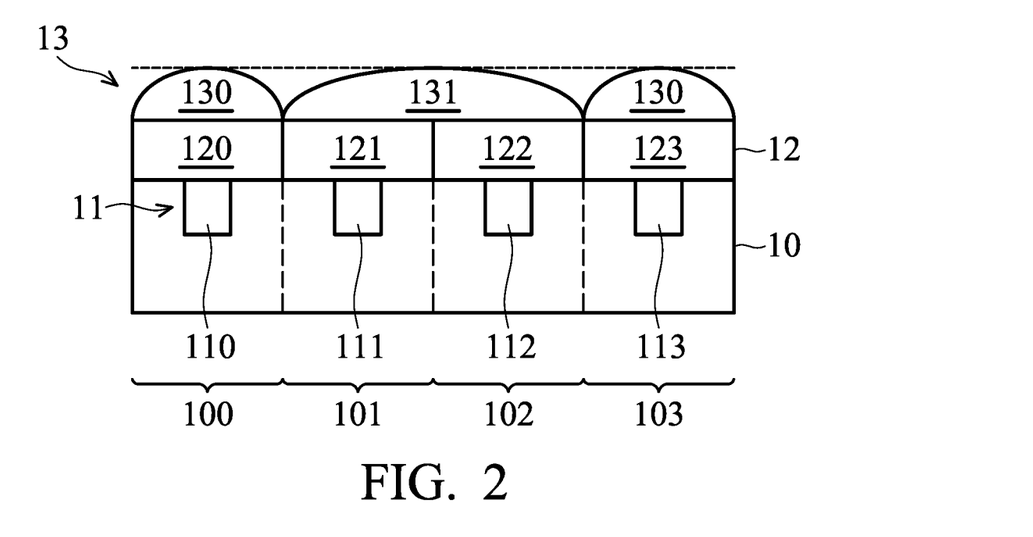
FIG. 2 shows another exemplary embodiment of a cross section of an image sensor.

The micro-lenses 130 and 131 arranged in the micro-lens array 13 are formed on the filter layer 12. As shown in FIG. 1, each of the micro-lenses 130 corresponds to one pixel unit (1×1), while the micro-lens 131 corresponds to two pixel units (1×2). In detail, the left micro-lens 130 corresponds to the filter 120 and the photo-sensor 110, the right micro-lens 130 corresponds to the filter 123 and the photo-sensor 113, and the micro-lens 131 corresponds to the filters 121 and 122 and the photo-sensors 111 and 112. Thus, the area of the micro-lens 131 is larger than the area of each micro-lens 130. Through a manufacture process of the image sensor 1 provided by an embodiment of the present invention, the height H11 of the micro-lens 131 is larger than the height H10 of each of the micro-lenses 130. Due to the different heights of the micro-lenses 130 and 131, the focal length of the micro-lens 131 is larger is than the focal lengths of the micro-lenses 130. In another embodiment, the height of the micro-lens 131 is equal to the height of each of the micro-lenses 130 as shown in FIG. 2, so that the focal lengths of the micro-lenses 130 and 131 are the same.

Figure 3A:
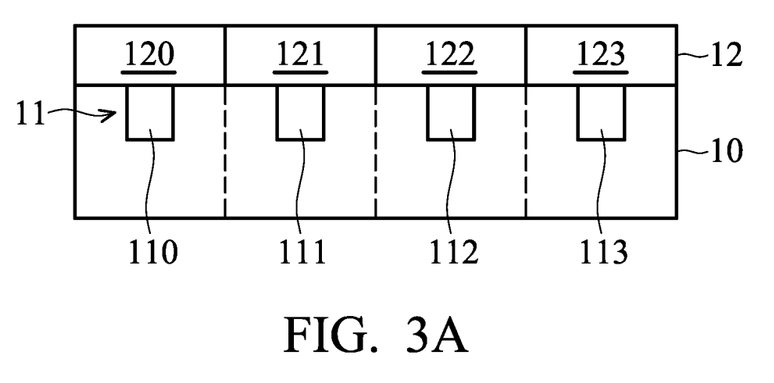
FIGS. 3A-3F show an exemplary embodiment of a manufacture process of the image sensor of FIG. 1.
Figure 3B:
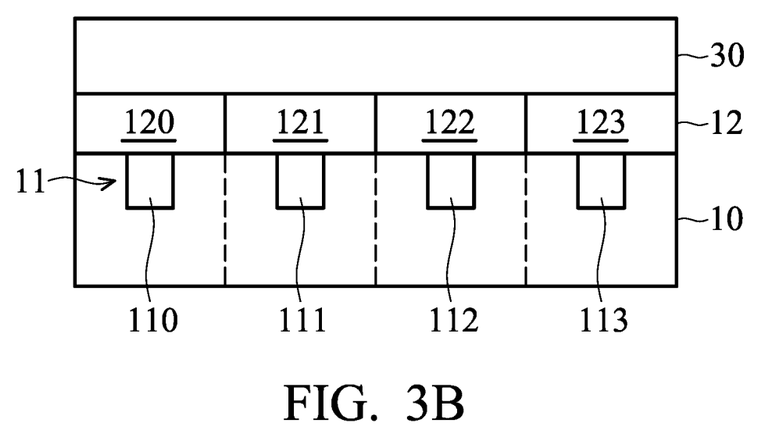
Figure 3C:
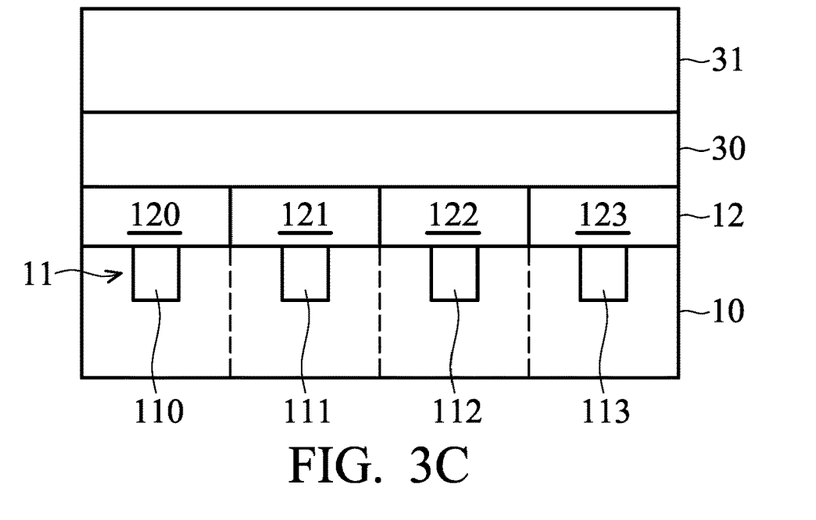

An exemplary embodiment of the manufacture process of the image sensor 1 is described with reference to FIGS. 3A-3F. In the embodiment, the multi-height micro-lenses 131) and 131 are given as an example for illustration. FIG. 3A shows a cross section of the image sensor 1 without the micro-lenses 130 and 131. As shown in FIG. 3A, the substrate 10 is provided. The photo-sensor array 11 is formed in the substrate 10, and the filter layer 12 is formed on the substrate 10. Then, referring to FIG. 3B, an under layer 30 is formed on the filter layer 12. In some embodiments, the under layer 30 is made of silicon oxide, silicon nitride, silicon oxynitride, silicon carbide, another suitable material, or a combination thereof. In some embodiments, the under layer 30 has a multi-layer structure. Referring to FIG. 3C, a hard-mask layer 31 is formed on the under 30. In the embodiment of FIG. 3C, the hard-mask layer 31 has a positive photoresist.

Figure 3D:
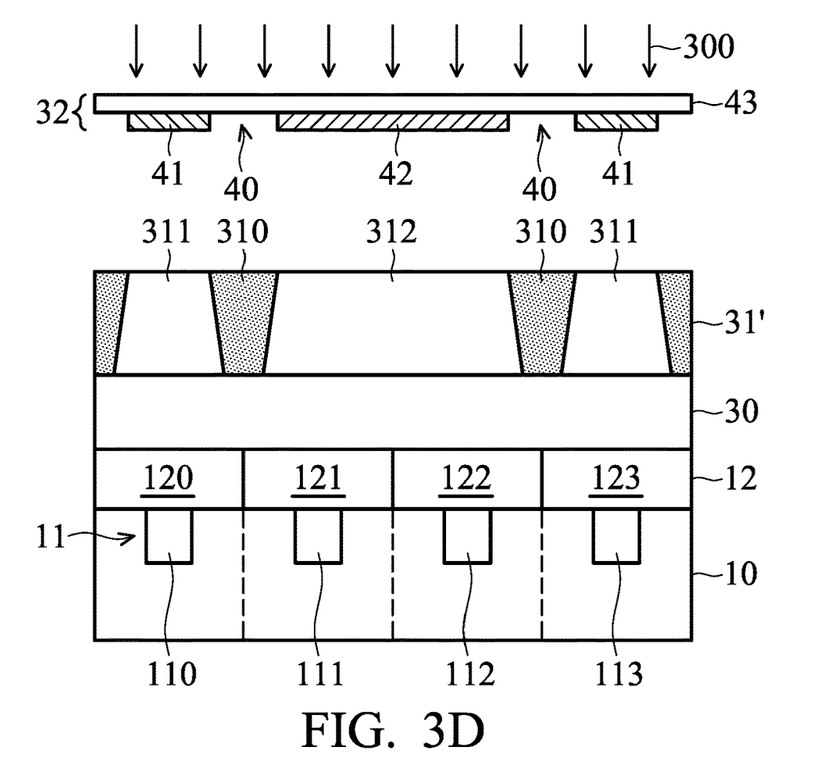
Figure 4:
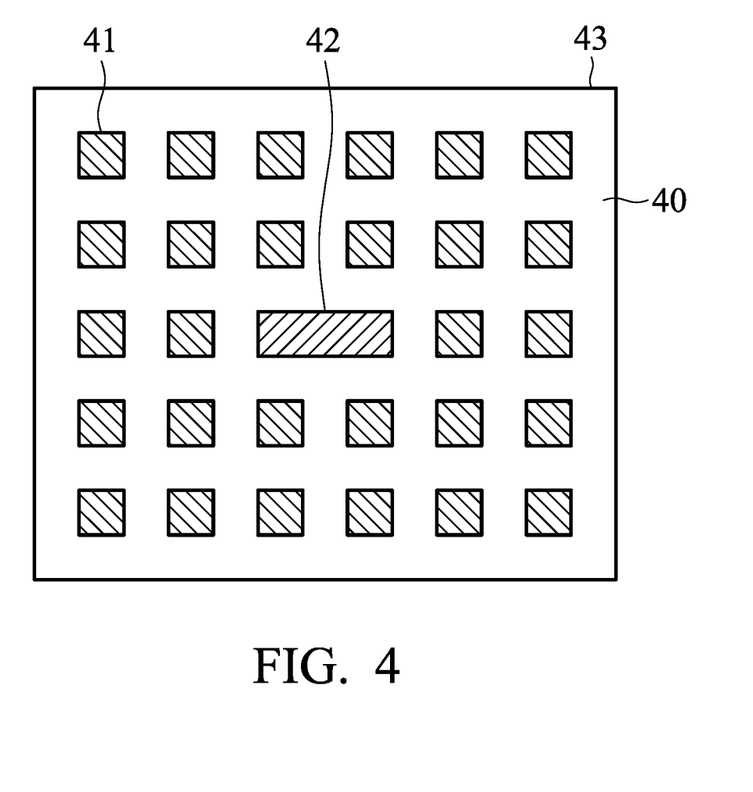
FIG. 4 shows an exemplary embodiment of a top view of a photomask for the image sensor of FIG. 1.

Then, as shown in FIG. 3D, a lithography process is processed on the hard-mask layer 31 by using a photomask 32. The hard-mask layer 31 is exposed to light 300 through the photomask 32 to form a hard-mask layer 31' which comprises exposed portions 310 and unexposed portions 311 and 312. FIG. 4 shows a top view of the photomask 32. Referring to FIG. 4, the photomask 32 comprises a transparent substrate 43 and a plurality of segments including a plurality of pattern segments 41 and at least one pattern segment 42 to define a transparent region 40 and a plurality of masking regions. Specifically, the masking regions of the photomask 32 are defined by the segments 41 and 42. The number of segments of the photomask 32 is given as an example. In practice, the number of segments of the photomask 32 is determined according the number of micro-lenses to be formed. In FIG. 4, the photomask 32 comprising only one segment 42 is given as an example. In the embodiment, the area of the segment 42 is larger than the area of each segment 41. During the lithography process, the regions 310 of the hard-mask layer 31 are exposed to the light 300 through the transparent region 40. The pattern of each segment of the photomask 32 is projected on a region of the hard-mask layer 31. For example, the patterns of the segments 41 are projected on the unexposed portions 311 of the hard-mask layer 31 while the pattern of the segment 42 is projected on the unexposed portion 312 of the hard-mask laver 31.

Figure 5:
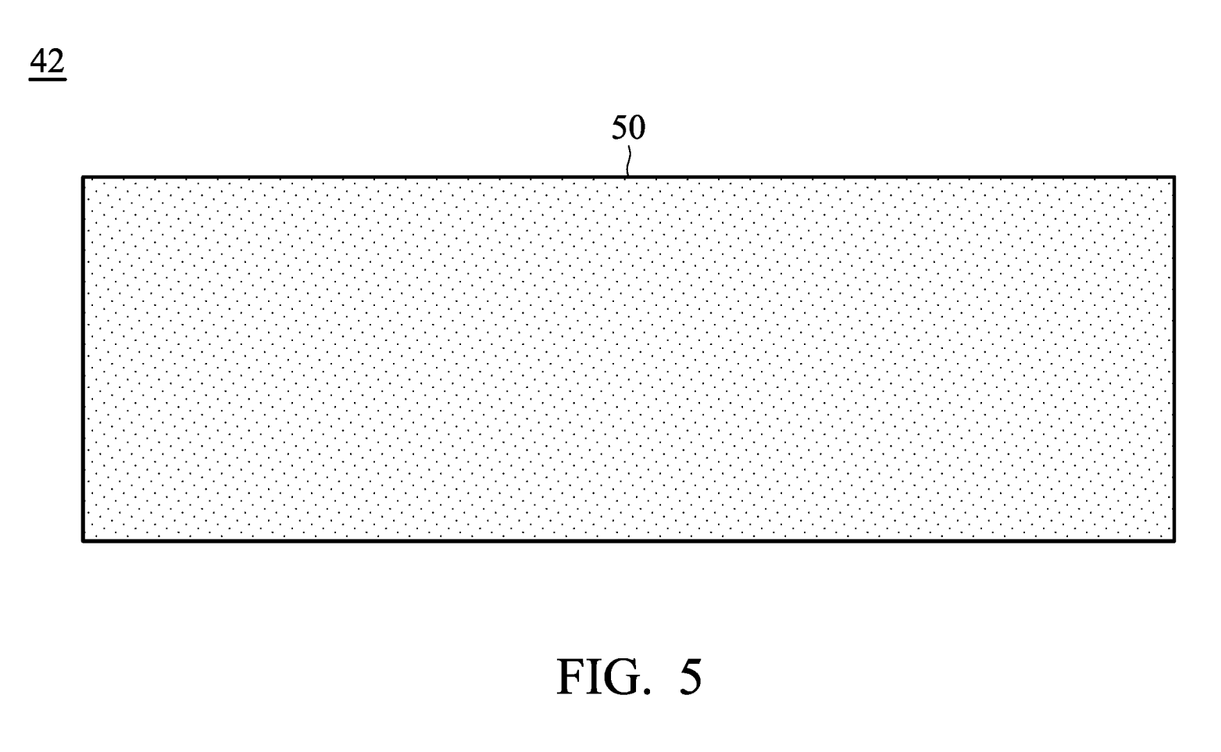
FIG. 5 shows an exemplary embodiment of a top view of a larger segment of the photomask shown in FIG. 4.
Figure 6A:
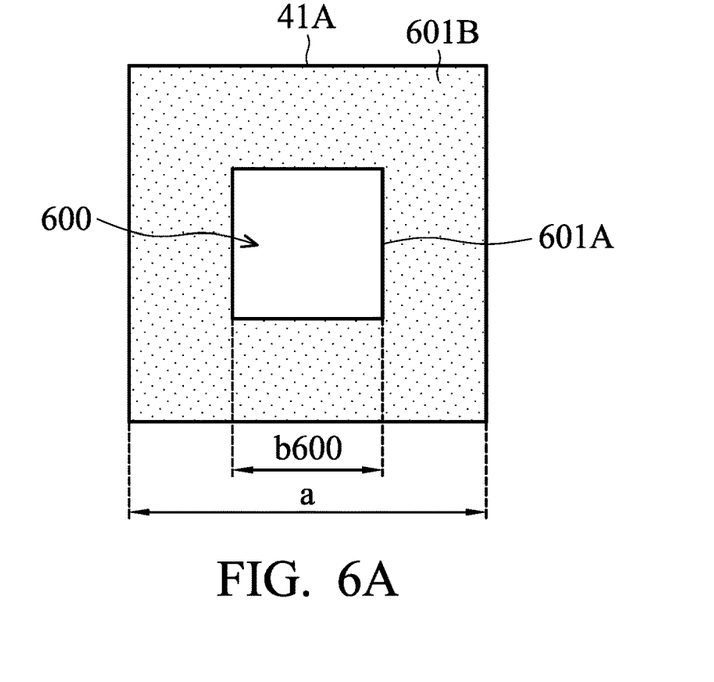
FIGS. 6A-6G show various exemplary embodiments of top views of smaller segments of the photomask shown in FIG. 4.

In the embodiment, the segment 42 is an opaque segment 50 as shown in FIG. 5, while each segment 41 comprises at least one opening with a polygonal shape (such as a triangular shape, a rectangular shape, a pentagon, or any closed shape with more than two sides) or a circular shape. FIG. 6A shows one exemplary embodiment of the top view of the segments 41. At least one of the segments 41 of FIG. 4 has the same layout of the segment 41A shown in FIG. 6A. Referring to FIG. 6A, the segment 41A comprises an opening 600 which defines a transparent region 601A of the segment 41A. Thus, the transparent region 601A is formed by one single opening 600. The remaining portion of the segment 41A, excluding the opening 600, defines an opaque region 601B of the segment 41A. The area of the transparent region 601A is larger than 18% of the area of the segment 41A. In other words, the area of the opening 600 is larger than 18% of the area of the segment 41A. According to another embodiment, the area of the transparent region 601A is larger than 18% of the area of the segment 41A and smaller than 50% of the area of the segment 41A. In the embodiment, the shape of the segment 41A is square (rectangular shape), and the shape of the opening 600 is also square. The shape of the transparent region 601A formed by the opening 600 is also square. The center point of the segment 41A and the center point of the opening 600 are at the same position. The four sides of the opening 600 are parallel with the four sides of the segment 41A. In an embodiment where the pixel unit is equal to 1.0 um (micro meter), when the side length (b600) of the opening 600 is designed to be larger than 0.42 times the side length (a) of the segment 41A (b600>0.42*a), the area of the transparent region 601A is larger than 18% of the area of the segment 41A. For example, when the side length (a) of the segment 41A is set to be 0.716 um (a=0.716 um), the side length (b600) of the opening 600 has to be larger than 0.3 um (b>0.3 um).

Figure 6B:
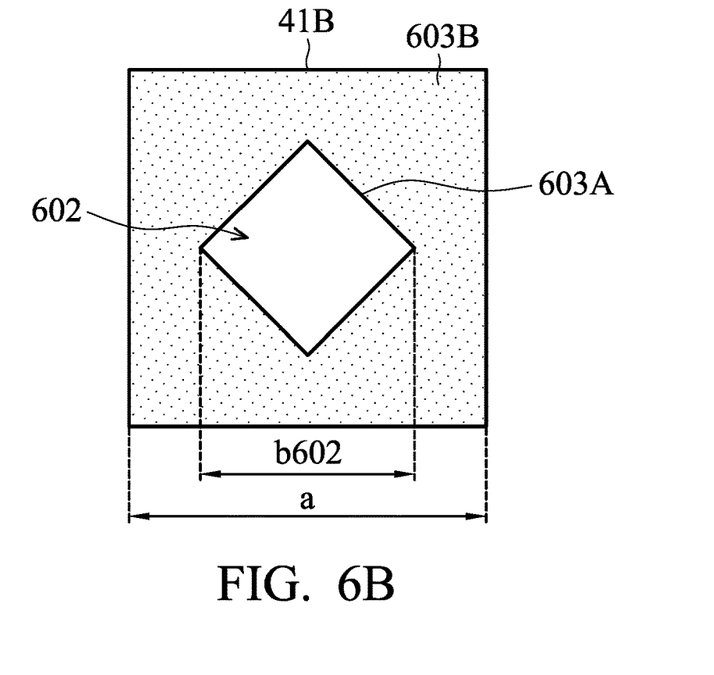

FIG. 6B shows another exemplary embodiment of the top view of the segments 41. At least one of the segments 41 of FIG. 4 has the same layout of the segment 41B shown in FIG. 6B. Referring to FIG. 6B, the segment 41B comprises an opening 6)2 which defines as a transparent region 603A of the segment 41B. Thus, the transparent region 603A is formed by one single opening 602. The remaining portion of the segment 41B, excluding the opening 602, defines as an opaque region 603B of the segment 41B. The area of the transparent region 603A is larger than 18% of the area of the segment 41B. In other words, the area of the opening 602 is larger than 18% of the area of the segment 41B. According to another embodiment, the area of the transparent region 603A is larger than 18% of the area of the segment 41B and smaller than 50% of the area of the segment 41B. In the embodiment, the shape of the segment 41B is square, and the shape of the opening 602 is also square. The shape of the transparent region 603A formed by the opening 602 is also square. The center point of the segment 41B and the center point of the opening 602 are at the same position. One diagonal line of the opening 602 is parallel with one pair of opposite sides of the segment 41B, and the other diagonal line of the opening 602 is parallel with the other pair of opposite sides of the segment 41B. In the embodiment where the pixel unit is equal to 1.0 um, when the length (b602) of each diagonal line of the opening 602 is designed to be larger than 0.6 times the side length (a) of the segment 41A (b602>0.6*a), the area of the transparent region 603A is larger than 18% of the area of the segment 41B.

Figure 6C:
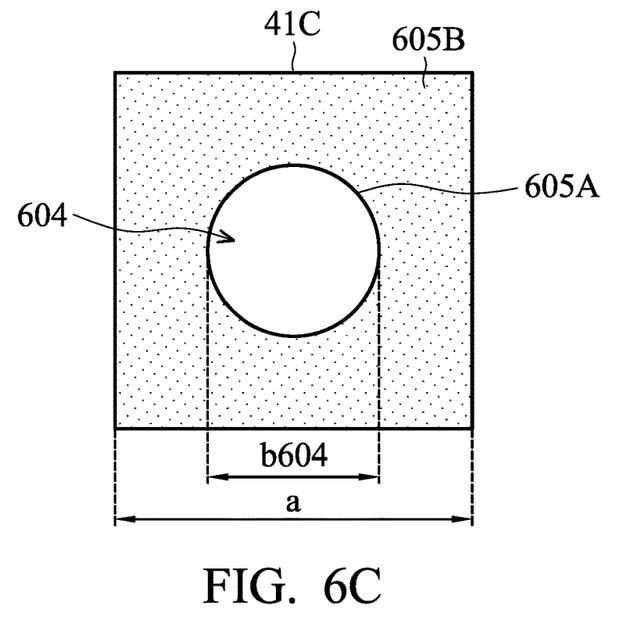

FIG. 6C shows another exemplary embodiment of the top view of the segments 41. At least one of the segments 41 of FIG. 4 has the same layout of the segment 41C shown in FIG. 6C. Referring to FIG. 6C, the segment 41C comprises an opening 604 which defines as a transparent region 605A of the segment 41B. Thus, the transparent region 605A is formed by one single opening 604. The remaining portion of the segment 41C, excluding the opening 604, defines as an opaque region 605B of the segment 41C. The area of the transparent region 605A is larger than 18% of the area of the segment 41C. In other words, the area of the opening 604 is larger than 18% of the area of the segment 41C. According to another embodiment, the area of the transparent region 605A is larger than 18% of the area of the segment 41C and smaller than 50% of the area of the segment 41C. In the embodiment, the shape of the segment 41C is square, while the shape of the opening 604 is circular. The shape of the transparent region 605A formed by the opening 604 is also circular. The center point of the segment 41C and the center point of the opening 604 are at the same position. In the embodiment where the pixel unit is equal to 1.0 um, when the length (b604) of the diameter of the opening 604 is designed to be larger than 0.48 times the side length (a) of the segment 41C (b604>0.48*a), the area of the transparent region 605A is larger than 18% of the area of the segment 41C.

Figure 6D:
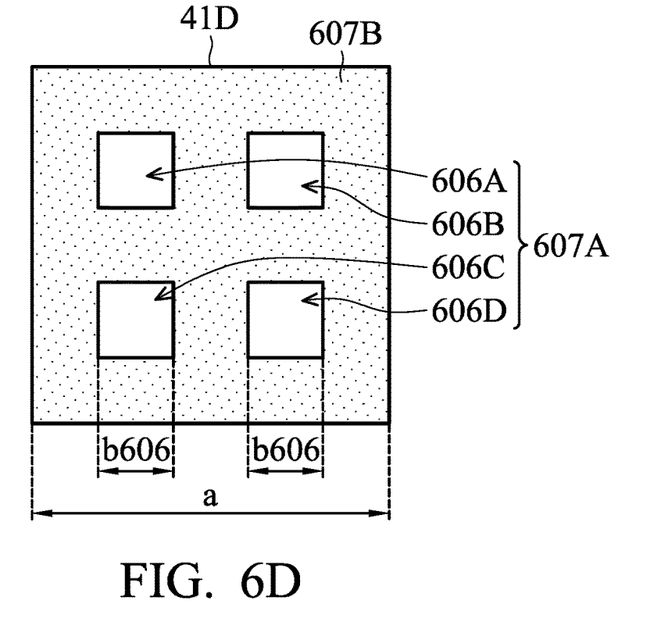

FIG. 6D shows another exemplary embodiment of the top view of the segments 41. At least one of the segments 41 of FIG. 4 has the same layout of the segment 41D shown in FIG. 6D. Referring to FIG. 6D, different from the embodiments of FIGS. 6A-6C, the segment 41D comprises more than one opening, which define a transparent region 607A of the segment 41D. In the embodiment of FIG. 6D, four openings 606A-606D are given as an example. Thus, the area of the transparent region 607A is equal to the sum of the areas of the openings 606A-606D. The remaining portion of the segment 41D, excluding the openings 606A-606D, defines an opaque region 607B of the segment 41D. The area of the transparent region 607A is larger than 18% of the area of the segment 41D. In other words, the total area of the openings 606A-606D is larger than 18% of the area of the segment 41D. According to another embodiment, the area of the transparent region 607A is larger than 18% of the area of the segment 41D and smaller than 50% of the area of the segment 41D. In the embodiment, the shape of the segment 41D is square, and the shape of each of the openings 606A-606D is also square. The openings 606A-606D are spaced apart from each other. As shown in FIG. 6D, the openings 606A-606D are disposed near the center point of the segment 41D and symmetrically based on the center point of the segment 41D. The four sides of each of the openings 606A-606D are parallel with the four sides of the segment 41D. In an embodiment where the pixel unit is equal to 1.0 um, when the side length (b606) of each of the openings 606A-606D is designed to be larger than 0.21 times the side length (a) of the segment 41D (b606>0.21*a), the area of the transparent region 607A is larger than 18% of the area of the segment 41D.

Figure 6E:
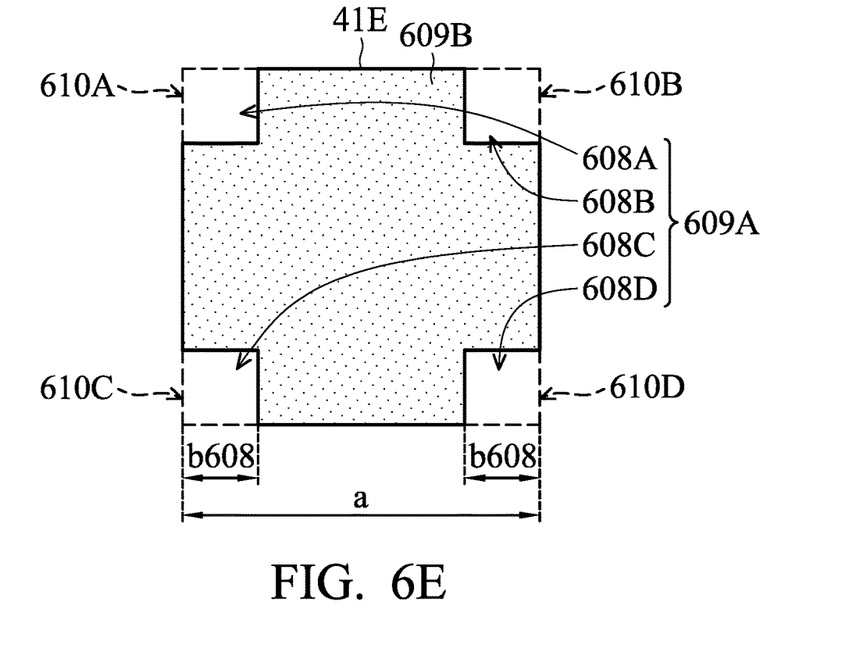

In the embodiment of FIG. 6D, the openings 606A-606D are disposed near the center point of the segment 41D. In another embodiment, the openings may be disposed in the corners of the segment 41D, as shown in FIG. 6E. FIG. 6E shows another exemplary embodiment of the top view of the segments 41. At least one of the segments 41 of FIG. 4 has the same layout of the segment 41E shown in FIG. 6E. The segment 41E comprises more than one opening, which define a transparent region 609A of the segment 41E. In the embodiment of FIG. 6E, four openings 608A-608D are given as an example. Thus, the area of the transparent region 609A is equal to the sum of the areas of the openings 608A-608D. The remaining portion of the segment 41E, excluding the openings 608A-608D, defines an opaque region 609B of the segment 41E. The area of the transparent region 609A is larger than 18% of the area of the segment 41E. In other words, the total area of the openings 608A-608D is larger than 18% of the area of the segment 41E. According to another embodiment, the area of the transparent region 609A is larger than 18% of the area of the segment 41E and smaller than 50% of the area of the segment 41E. In the embodiment, the shape of the segment 41E is square, and the shape of each of the openings 608A-608D is also square. The openings 608A-608D are spaced apart from each other. Due to the square shape, the segment 41E comprises four corners 610A-610D. The openings 608A-608D are disposed in the corners 610A-610D respectively.

The four sides of each of the openings 608A-608D are parallel with the four sides of the segment 41E. In an embodiment where the pixel unit is equal to 1.0 um, when the side length (b608) of each of the openings 608A-608D is designed to be larger than 0.21 times the side length (a) of the segment 41E (b608>0.21*a), the area of the transparent region 609A is larger than 18% of the area of the segment 41E.

Figure 6F:
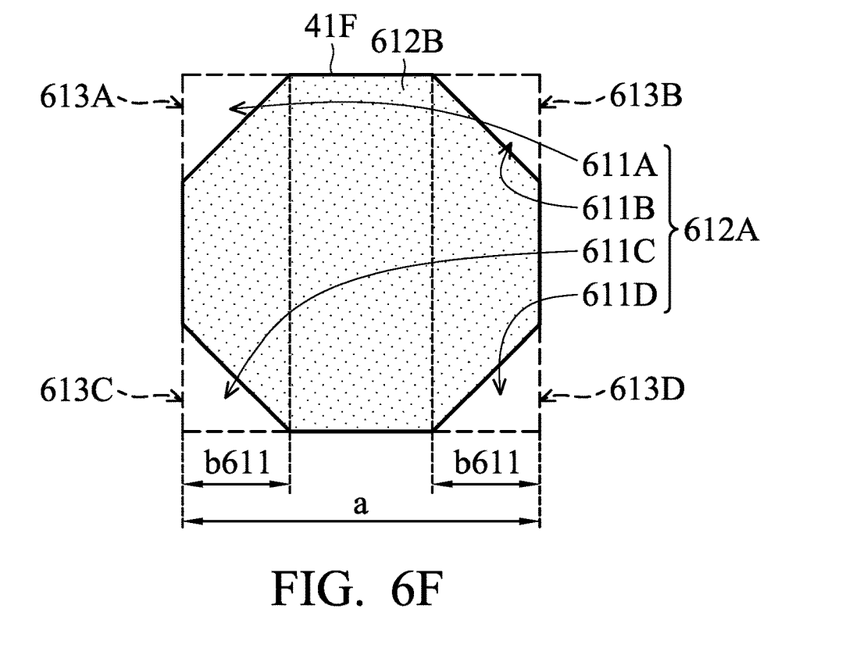

In the embodiment of FIG. 6E, the shapes of the openings 608A-608D are square. In another embodiment, the shapes of the openings may be triangular, as shown in FIG. 6F. FIG. 6F shows another exemplary embodiment of the top view of the segments 41. At least one of the segments 41 of FIG. 4 has the same layout of the segment 41F shown in FIG. 6F. The segment 41F comprises more than one opening, which define a transparent region 612A of the segment 41F. In the embodiment of FIG. 6F, four openings 611A-611D are given as an example. Thus, the area of the transparent region 612A is equal to the sum of the areas of the openings 611A-611D. The remaining portion of the segment 41F, excluding the openings 611A-611D, defines an opaque region 6012B of the segment 41F. The area of the transparent region 612A is larger than 18% of the area of the segment 41F. In other words, the total area of the openings 611A-611 is larger than 18% of the area of the segment 41F. According to another embodiment, the area of the transparent region 612A is larger than 18% of the area of the segment 41F and smaller than 50% of the area of the segment 41F. In the embodiment, the shape of the segment 41F is square, while the shape of each of the openings 611A-611D is triangular. Specifically, the shape of each of the openings 611A-611D is an isosceles triangle. The openings 611A-611D are spaced apart from each other. Due to the square shape, the segment 41F comprises four corners 613A-613D. The openings 611A-611D are disposed in the corners 613A-613D respectively. For each of the openings 611A-611D, the two sides of equal length correspond to one pair of adjacent sides of the segment 41F respectively. In an embodiment where the pixel unit is equal to 1.0 um, when the side length (b611) of each of the openings 611A-611D is designed to be larger than 0.30 times the side length (a) of the segment 41F (b611>0.30*a), the area of the transparent region 612A is larger than 18% of the area of the segment 41F.

Figure 6G:
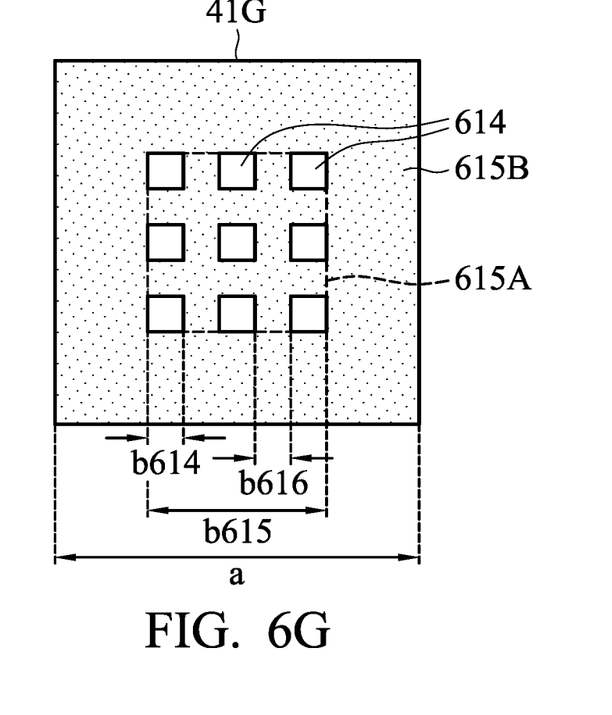

FIG. 6G show s another exemplary embodiment of the top view of the segments 41. At least one of the segments 41 of FIG. 4 is the same as the segment 410 shown in FIG. 6G. The segment 41G comprises a plurality of openings which are spaced apart from each other and disposed on the center area of the segment 41G. In the embodiment of FIG. 6G, nine openings 614 are given as an example. The nine openings 614 and the space between the openings 614 define a transparent region 615A of the segment 41G. Thus, the area of the transparent region 615A is equal to the sum of the areas of the openings 614 and the area of the space between the openings 64. The remaining portion of the segment 41G, excluding the transparent region 615A, defines an opaque region 615B of the segment 41G. In the embodiment, the shape of the segment 41E is square, and the shape of the transparent region 615A is also square. Moreover, the shape of each of the openings 614 is square. The four sides of each of the openings 614 are parallel with the four sides of the segment 41G. The area of the transparent region 615A is larger than 18% of the area of the segment 41G. According to another embodiment, the area of the transparent region 615A is larger than 18% of the area of the segment 41G and smaller than 50% of the area of the segment 41G. In an embodiment where the pixel unit is larger than 5.00 um, when the side length (b615) of the transparent region 615A is designed to be larger than 0.42 times the side length (a) of the segment 41G (b615>0.42*a), the area of the transparent region 615A is larger than 18% of the area of the segment 41G. As described above, the transparent region 615A is defined b, nine openings 614 and the space between the openings 614. In the embodiment where there are nine openings in the transparent region 615A, to meet the condition in which the side length (b615) of the transparent region 615A is larger than 0.42 times the side length (a) of the segment 41G (b615>0.42*a), the side length (b614) of each of the openings 614 is equal to 0.2) times the side length ( ) of the transparent region 615A (b614=0.2*b615), and the distance (b616) between the two adjacent openings 614 is also equal to 0.20 times the side length (b615) of the transparent region 615A (b616=0.2*b615). The relationship between the side length (b614) and the side length (b615) and the relationship between the distance (b616) and the side length (b615) are taken as an example for illustration. In other embodiments, the relationship between the side length (b614) and the side length (b615) and the relationship between the distance (b616) and the side length (b615) are determined according to the number of openings in the transparent region 615A and the arrangement of the openings in the transparent region 615A. According to the embodiments of FIGS. 61-6G, the transparent region 607A/609A/612A/615A of the segment 41D/41E/41F/41G is formed by several openings.

Figure 3E:
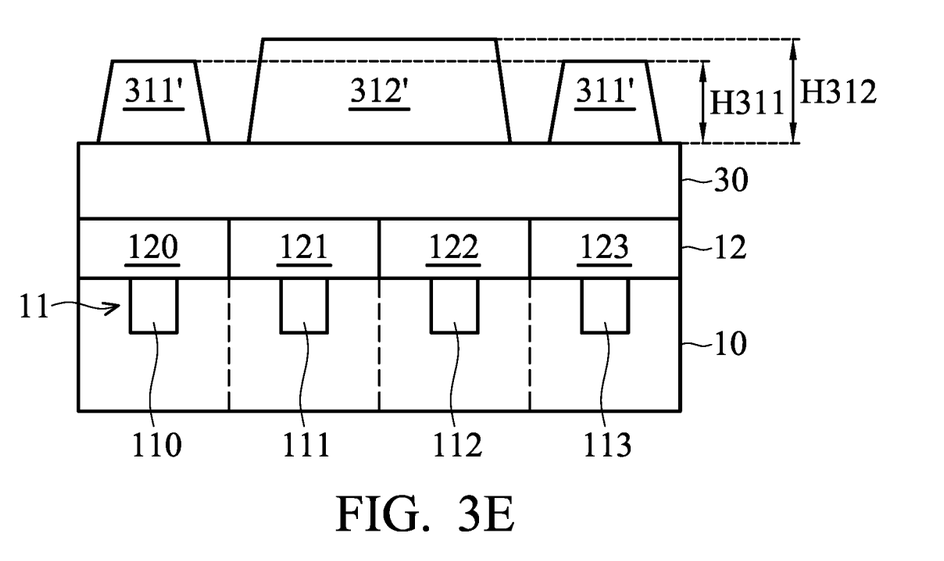

Referring to FIG. 3E, after the exposure to the hard-mask layer 31, the hard-mask 31' is optionally developed by a developing solution to remove the exposed portions 310. The unexposed portions 311 and 312 are left on the under 30 to form patterns 311' and 312'. Referring to the embodiments of FIGS. 5 and 6A-6G, each segment 41 comprises at least one opening, while the segment 42 is opaque. Thus, transmittance of each segment 41 is larger than the transmittance of the segment 42. In the cases where the segments 41 corresponding to the unexposed portions 311 have the same layout, the transmittance of the left segment 41 shown in FIG. 3D is equal to the transmittance of the right segment 41 shown in FIG. 3D. Accordingly, after the developing step, the height H311 of each pattern 311' is smaller than the height H312 of the pattern 312' (H311<H312); that is, the height H312 of the pattern 312' is larger than the height H311 of each pattern 311' (H312>H311).

Figure 3F:
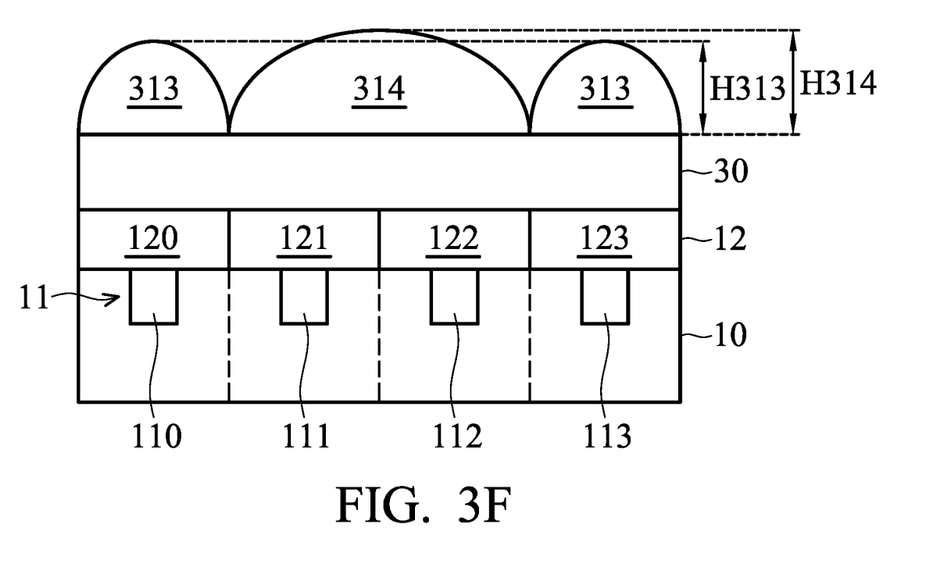

Then, referring to FIG. 3F, the patterns 311 and the pattern 312 are reflowed through a thermal process to form lens structures 313 and a lens structure 314 respectively. As described above, the height H312 of the pattern 312' is larger than the height H311 of each pattern 311' (H312>H311). Thus, after the thermal process, that is, the height H314 of the lens structure 314 is larger than the height H313 of each lens structure 313 (H314>H313).

After the lens structures 313 and the lens structure 314 are formed, the under layer 30 is etched by using the lens structures 313 and the lens structure 314 as an etching mask to form the micro-lenses 130 and the micro-lens 131 respectively, as shown in FIG. 1, as described above, the height H314 of the lens structure 314 is larger than the height H313 of each lens structure 313 (H314>H313). Thus, after the etching step, the height H11 of the micro-lens 131 is larger than the height H10 of each micro-lens 130.

According to the above embodiments, each segment 41 comprises at least one opening, while the segment 42 is opaque. Accordingly, the micro-lenses with multi-heights can be formed by using the photomask 32 comprising the pattern segments 41 and 42 during the lithography process.

Specifically, the height of the micro-lens corresponding to two pixel units is larger than the heights of other micro-lenses.

Figure 7:
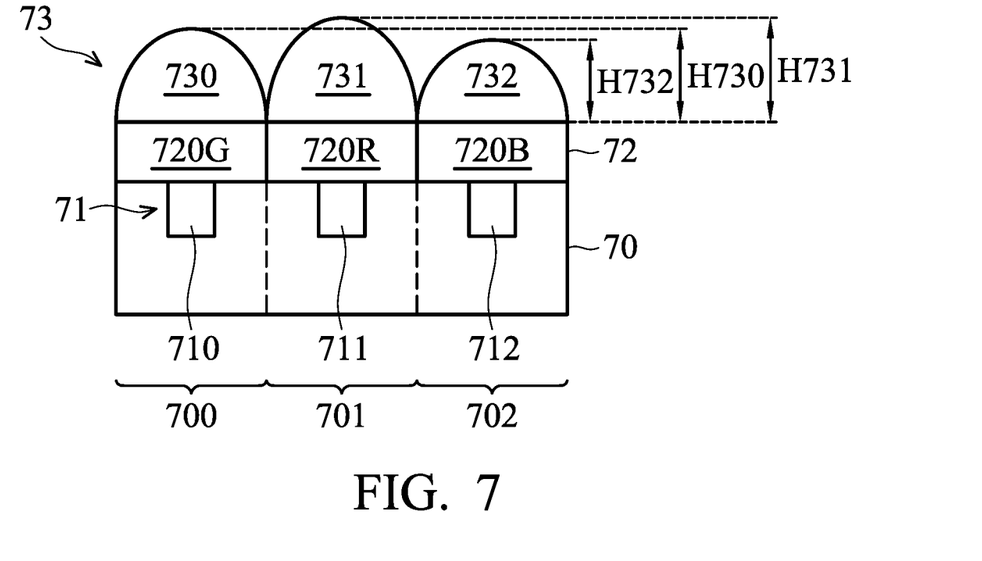
FIG. 7 shows another exemplary embodiment of a cross section of an image sensor.

In the above embodiment of FIG. 1, the micro-lens 131 corresponds to two pixel units, while each of the micro-lenses 130 corresponds to one pixel unit. In other embodiments, each micro-lens corresponds to the same number of pixel units. For example, each micro-lens corresponds to one or two pixel units. In this case, the micro-lenses may have different heights, and the height of each micro-lens is determined according to the type of the corresponding filter. As shown in FIG. 7, an image sensor 7 comprises a plurality of micro-lenses which are arranged in rows and columns to form a micro-lens array 73. For clear illustration. FIG. 7 shows micro lenses 730-732 for the side view. The number of micro-lenses in the micro-lens array 73 is determined according to the design requirements. As shown in FIG. 7, a substrate 70 is provided, and a plurality of photo-sensors are formed in the substrate 71) and arranged in rows and columns to form a photo-sensor array 71. In FIG. 7, three photo-sensors 710-712 are shown for the cross section. A filter layer 72 is formed on the substrate 70. The filter layer 72 comprises filters, and one filter corresponds to one photo-sensor. The filters of the filter layer 72 are color filters, such as red filters, green filters, and blue filters for the primary color system, or cyan filters, yellow filters, and magenta filters for the complementary color system. In the embodiment, the filter layer 72 comprises red filters, green filters, and blue filters for the primary color system is given as an example. FIG. 7 shows a green filter 720G, a red filter 720R, and a blue filter 720B A pixel unit is defined by a set of one photo-sensor and one filter, and the image sensor 7 is divided into several pixel regions by using the pixel unit. As shown in FIG. 7, the substrate 70 is divided into three equal pixel regions 700-702 by using the pixel unit.

The micro-lenses 730-732 arranged in the micro-lens array 73 are formed on the filter layer 72. As shown in FIG. 7, each of the micro-lenses 730-732 corresponds to one pixel unit. In detail, the micro-lens 730 corresponds to the green filter 720G and the photo-sensor 710, the micro-lens 731 corresponds to the red filter 720R and the photo-sensor 711, and the micro-lens 732 corresponds to the blue filter 720B and the photo-sensor 712. In response to the different wavelengths of red, green, and blue light, the height H731 of the micro-lens 731 corresponding to the red filter 720R is larger than the height H730 of the micro-lens 730 corresponding to the green filter 720G, and the height H730 of the micro-lens 730 is larger than the height H732 of the micro-lens 732 corresponding to the blue filter 720B (H731>H730>1732). Thus, the focal length of the micro-lens 731 is larger than the focal length of the micro-lens 730, and the focal length of the micro-lens 730 is larger than the focal length of the micro-lens 732.

Figure 8:
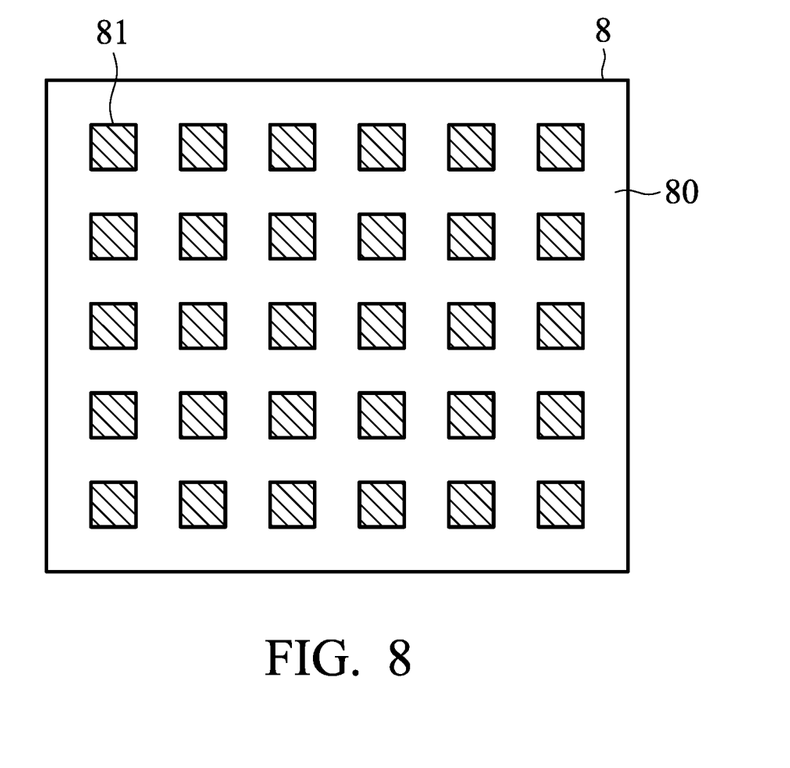
FIG. 8 shows an exemplary embodiment of a top view of a photomask for the image sensor of FIG. 7.

The manufacture process of the image sensor 7 is similar to the manufacture process of the image sensor 1 shown in FIGS. 3A-3F. However, the photomask used in the lithography process for forming the micro-lenses 730-732 is different from the photomask 32 used in the lithography process for forming the micro-lenses 130 and 131. As shown in FIG. 8, the photomask 8 used in the lithography process for the image sensor 7 comprises a transparent substrate 80 and a plurality of pattern segments 81. The number of segments of the photomask 80 is given as an example. In practice, the number of segments of the photomask 80 is determined according the number of micro-lenses to be formed. The areas of the segments 81 are the same, in other words, the area of the segment for the micro-lens 731 is equal to the area of the segment for each of the micro-lenses 730 and 732. Each segment 81 is used to form one microlens through the lithography process, the reflowing step, and the etching step. In the embodiment of FIG. 8, each segment 81 has one of the layouts shown in FIGS. 6A-6G. Through adjusting the areas of the transparent regions of the segments 81, the transmittance of at least one segment 81 is different from the transmittances of the other segments 81 so that the height of at least one micro-lens is different from the heights of the other micro-lenses. In the embodiment of FIGS. 7 and 8, through setting the area of the transparent region of the segment 81 corresponding to the micro-lens 731 to be smaller than that of the segment 81 corresponding to the micro-lens 730 and setting that of the segment 81 corresponding to the micro-lens 730 to be smaller than that of the segment 81 corresponding to the micro-lens 732, the height H731 of the micro-lens 731 corresponding to the red filter 720R is larger than the height H730 of the micro-lens 730 corresponding to the green filter 720G, and the height H730 of the micro-lens 731) corresponding to the green filter 720G is larger than the height H732 of the micro-lens 732 corresponding to the blue filter 720B (H731>H730>H732). In the embodiment, the segments 81 for the micro-lens 730-732 may have the same layout (such as one of the layouts shown in FIGS. 6A-6G) or different layouts (such as three different layouts among the layouts shown in FIGS. 6A-6G). In other embodiments, the segment 81 for the micro-lens 732 with the smallest height can be an opaque segment as shown in FIG. 5.

In the embodiments wherein each segment 41 comprises more than one opening, such as the segments 41D, 41E, and 41F, four openings are given as an example for each segment 41. In other embodiments, when each segment 41 is designed to comprise more than one opening, openings with odd number can be formed for each segment 41.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a micro-lens array comprising:
   providing a substrate;
   forming a plurality of photo-sensors in the substrate and arranging the photo-sensors to form a photo-sensor array;
   forming a filter layer on the substrate;
   forming an under layer directly on the filter layer;
   forming a hard-mask layer on the under layer;
   performing a lithography process on the hard-mask layer by a photomask to form a first pattern and a plurality of second patterns;
   reflowing the first pattern and the plurality of second patterns to form a first lens structure and a plurality of second lens structures respectively; and
   etching the under layer by using the first lens structure and the plurality of second lens structures as an etching mask to form a first micro-lens and a plurality of second micro-lenses respectively,
   wherein the photomask comprises:
      a first transparent region;
      a first pattern segment corresponding to the first pattern; and
      a plurality of second pattern segments corresponding to the plurality of second patterns respectively,
   wherein the first pattern segment is opaque,
   wherein the first pattern segment and the plurality of second pattern segments are separated by a plurality of portions of the first transparent region, the plurality of second pattern segments surround the first pattern segment, and a shape of the first pattern segment is different from a shape of each of the plurality of second pattern segments,
   wherein the shape of the first pattern segment is rectangular, and each of the plurality of second pattern segments is a square,
   wherein each of the plurality of second pattern segments comprises an opaque square region with nine openings disposed on a center area of the opaque square region, and a space between the nine openings is transparent,
   wherein an area of the second transparent region of the second pattern segment is larger than 18% and smaller than 50% of an area of the second pattern segment, and
   wherein the first pattern segment and each of the plurality of second pattern segments correspond to a single micro-lens.

2. The method as claimed in claim 1, wherein an area of the first pattern segment is larger than an area of each of the plurality of second pattern segments.

3. The method as claimed in claim 1, further comprising:
   providing a substrate, wherein the substrate comprises a plurality of pixel regions;
   forming a plurality of photo-sensors in the plurality of pixel regions respectively,
   wherein the first lens structure corresponds to two of the plurality of photo-sensors, and each of the plurality of second lens structures corresponds to one of the plurality of photo-sensors.

4. The method as claimed in claim 1, further comprising:
   forming a filter layer comprising a plurality of color filters,
   wherein the plurality of color filters correspond to the plurality of photo-sensors.

5. The method as claimed in claim 1, wherein a height of the first micro-lens is larger than a height of each of the plurality of second micro-lenses.

6. The method as claimed in claim 1, wherein an area of the first micro-lens is larger than an area of each of the plurality of second micro-lenses, further comprising:
   forming a filter layer comprising a first color filter and a second color filter,
   wherein the under layer is formed on the filter layer, and
   wherein the first color filter corresponds to the first micro-lens, and the second color filter corresponds to the second micro-lens.

\* \* \* \* \*